United States Patent
Franzese et al.

(10) Patent No.: US 12,237,558 B2
(45) Date of Patent: Feb. 25, 2025

(54) SWITCHABLE COMBINER AND/OR SPLITTER CIRCUIT COMPRISING WILKINSON ELEMENTS

(71) Applicant: IHP GmbH—Innovations for High Performance Microelectronics / Leibniz-Institut fur Innovative Microelektronik, Frankfurt (DE)

(72) Inventors: Aniello Franzese, Frankfurt (DE); Andrea Malignaggi, Frankfurt (DE)

(73) Assignee: IHP GMBH—INNOVATIONS FOR HIGH PERFORMANCE MICROELECTRONICS / LEIBNIZ-INSTITUT FÜR INNOVATIVE MIKROELEKTRONIK, Frankfurt (DE)

( * ) Notice: Subject to any disclaimer, the term of this patent is extended or adjusted under 35 U.S.C. 154(b) by 317 days.

(21) Appl. No.: 17/888,790

(22) Filed: Aug. 16, 2022

(65) Prior Publication Data

US 2023/0055351 A1    Feb. 23, 2023

(30) Foreign Application Priority Data

Aug. 19, 2021    (EP) ..................... 21192211

(51) Int. Cl.
*H01P 5/12* (2006.01)
*H03K 17/60* (2006.01)
(52) U.S. Cl.
CPC ............... *H01P 5/12* (2013.01); *H03K 17/60* (2013.01)

(58) Field of Classification Search
CPC ............. H01P 5/12; H01P 5/16; H03K 17/60
See application file for complete search history.

(56) References Cited

U.S. PATENT DOCUMENTS

| | | | |
|---|---|---|---|
| 11,043,931 B2* | 6/2021 | Lin | H03H 7/48 |
| 2017/0047904 A1* | 2/2017 | Szopko | H04B 1/0057 |
| 2019/0089401 A1* | 3/2019 | Zihir | H04B 1/18 |
| 2019/0109377 A1* | 4/2019 | Watanabe | H01Q 3/34 |
| 2019/0149104 A1 | 5/2019 | Suravarapu et al. | |
| 2019/0214700 A1 | 7/2019 | Wang et al. | |
| 2022/0190459 A1* | 6/2022 | Yang | H03H 7/06 |

OTHER PUBLICATIONS

EP Search Report and Opinion issued Feb. 1, 2022 by the EPO in corresponding Application No. EP21192211.7, 19 pages.

(Continued)

*Primary Examiner* — Quan Tra
(74) *Attorney, Agent, or Firm* — Ware, Fressola, Maguire & Barber LLP

(57) ABSTRACT

A switchable combiner and/or splitter circuit comprising at least two Wilkinson elements is suggested. The switchable circuit comprises one first terminal and for each Wilkinson element one pair of second terminals associated with the corresponding Wilkinson element. Each Wilkinson element connects the first terminal with the associated pair of second terminals. Each Wilkinson element includes a switchable component enabling selectively activating the associated pair of second terminals. The proposed solution combines a Single-Pole-Double-Through switch and a Wilkinson element and, thus, reduces the chip area required for integrating the circuit.

9 Claims, 7 Drawing Sheets

(56) References Cited

OTHER PUBLICATIONS

De, D. et al.: "Design and development of multi-port switchable power dividers", AEU—International Journal of Electronics and Communications, vol. 96, Nov. 1, 2018, pp. 184-192.

Zhu, W. et al.: "A 24-28 GHz Power and Area Efficient 4-Element Phased-Array Transceiver Front-End with 21.1%/16.6%Transmitter Peak/OP1dB PAE Supporting 2.4 GB/s in 256-QAM for 5-G Communications," 2020 IEEE Radio Frequency Integrated Circuits Symposium (RFIC), 2020, pp. 351-354, doi: 10.1109/RFIC49505.2020.9218328.

Kang, D. et al.: "Single and Four-Element Ka-Band Trans-mit/Receive Phased-Array Silicon RFICs With 5-bit Amplitude and Phase Control," in IEEE Transactions on Microwave Theory and Techniques, vol. 57, No. 12, pp. 3534-3543, Dec. 2009, doi: 10.1109/TMTT.2009.2033302.

Chen, C-N. et al., "A 38-GHz 32-Element Phased-Array Transmitter Based on Scalable 8-Element Phased-Array Modules for 5G MMW Data Links," 2020 IEEE/MTT-S International Microwave Symposium (IMS), 2020, pp. 695-698, doi: 10.1109/IMS30576.2020.9224068.

* cited by examiner

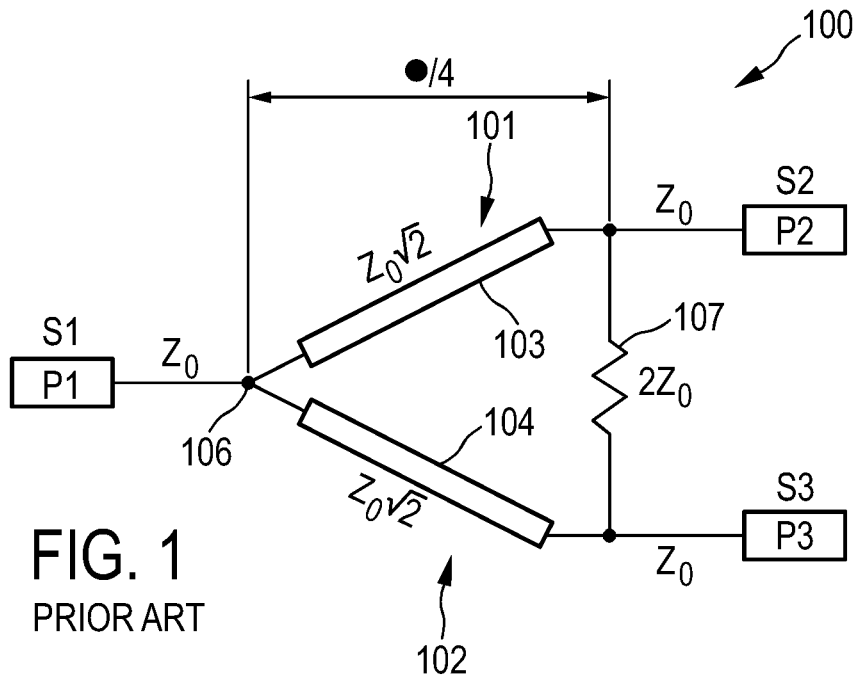
FIG. 1
PRIOR ART
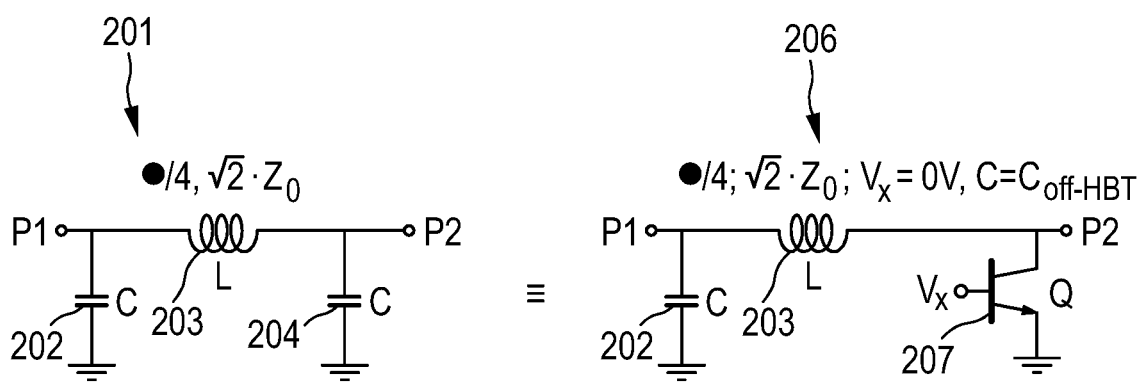
FIG. 2A
FIG. 2B

SWITCHABLE COMBINER AND/OR SPLITTER CIRCUIT COMPRISING WILKINSON ELEMENTS

CROSS-REFERENCE TO RELATED APPLICATION

This application claims priority under 35 USC § 119 to European Patent Application No. 21192211.7 filed on Aug. 19, 2021, which is hereby incorporated by reference in its entirety.

TECHNICAL FIELD

The present invention relates to a switchable combiner and/or splitter circuit and to systems comprising such circuit.

BACKGROUND OF THE INVENTION

Time-division multiplexing (TDM) is a method of transmitting and receiving independent signals over a common signal path by means of synchronized switches at each end of the transmission line so that each signal appears on the line only in a fraction of time in an alternating pattern. In some applications, for instance in radar and data communication systems, beamforming of the transmitted and/or received radio waves is utilized.

Beamforming or spatial filtering is a signal processing technique used in sensor arrays for directional signal transmission or reception. This is achieved by combining elementary antennas in an antenna array in such a way that signals at specific angles experience constructive interference while others experience destructive interference. In antenna theory, a phased array usually means an electronically scanned array, a computer-controlled array of antennas which creates a beam of radio waves that can be electronically steered to points in different directions without moving the antennas.

In a simple array antenna, the radio frequency current from the transmitter is fed to the individual antennas with the correct phase relationship so that the radio waves from the separate antennas add together to increase the radiation in a desired direction and cancel to suppress radiation in undesired directions. In a phased array, the power from the transmitter is fed to the antennas through devices called phase shifters, controlled by a computer system, which can alter the phase electronically, thus steering the beam of radio waves to a different direction. Since the array must consist of many small antennas (sometimes thousands) to achieve high gain, phased arrays are mainly practical at the high frequency end of the radio spectrum, in the UHF and microwave bands, in which the antenna elements are conveniently small.

Beamforming can be used e.g., for radio waves in a variety of applications in radar and wireless communication applications. Adaptive beamforming is used to detect and estimate the signal of interest at the output of a sensor array by means of optimal (e.g., least-squares) spatial filtering and interference rejection.

Usually, in high frequency radars or data communication time division multiplexing (TDM) systems, the operation mode (receiving (Rx) or transmitting (Tx)) is set using single-pole-double-through (SPDT) switches for directing the signal to a Tx or a Rx branch. Then, such branches, formed by amplifiers, phase shifters etc., are connected by splitters/combiners. The cascade of the two elements, i.e., Single-Pole-Double-Through (SPDT) switches and Wilkinson elements that are effective as power splitters and/or combiners, makes the beamformer chip area consuming. Indeed, both SPDT and splitter and/or combiner are mainly made of passive components, which are bulky especially when they must be integrated.

Recent works report on several beamformers with many components. The number of components is a multiple of four. For instance, FIGS. 7A-7C show the micrographs of three different beamformers 701-703 ([1]-[3]). As emphasized by the rectangles 704, the area occupation of the SPDTs plus the cascade of several Wilkinson elements is high.

Taking this as a starting point it is an object of the present invention to propose a switchable power combiner and/or splitter circuit that overcomes the before mentioned shortcomings or at least improves some or all of them.

SUMMARY OF THE INVENTION

According to a first embodiment a switchable combiner and/or splitter circuit comprising at least two Wilkinson elements is suggested. The switchable circuit comprises one first terminal and for each Wilkinson element one pair of second terminals associated with the corresponding Wilkinson element. Each Wilkinson element connects the first terminal with the associated pair of second terminals. Each Wilkinson element includes a switchable component enabling selectively activating the associated pair of second terminals.

Advantageously, the circuit provides for a switchable component in the Wilkinson element. The switchable component has two functionalities at the same time. In one embodiment the switchable component provides in its OFF state for a capacitance that is required to form a quarter wave transmission line for the Wilkinson element. In its ON state the switchable component and deactivates the Wilkinson element and enables deselecting a specific signal transmission path. In this sense the switchable component contributes with its functionality to create a SPDT switch. With this kind of "double use" of the switchable component it is possible to create a switchable combiner and/or splitter circuit that is a simpler than conventional circuits providing for the same functionality. If implemented in an integrated circuit, the simpler structure of the proposed circuit entails also that a smaller chip area is required compared to conventional circuits. This advantage is particularly interesting for integrated beamforming circuits.

The proposed solution combines a SPDT switch and a Wilkinson element and, thus, reduces the chip area required for integrating the circuit in a clever way. Furthermore, a single component instead of a cascade of two or more passive circuits decreases the overall losses. This is achieved because the Wilkinson becomes at the same time an SPDT switch and a power combiner and/or splitter circuit.

In one embodiment each Wilkinson element comprises a first and a second arm. The first arm connects the first terminal with one terminal of the associated pair of second terminals. The second arm connects the first terminal with the other terminal of the associated pair of second terminals.

In an advantageous further development one switchable component is integrated in every arm of the at least two Wilkinson elements. In this way it is possible to individually select the arms of the at least two Wilkinson elements. Inputs and outputs of the circuit are selectable on an as needed basis. This is particularly useful if the proposed circuit is implemented in a time division multiplexing system such as a radar and/or communication system.

In a preferred embodiment the switchable components alternatingly switch the at least two Wilkinson elements between
 (i) an active state, in which signals are transmitted from the first terminal to the associated pair of second terminals or are received from the associated pair of second terminals at the first terminal, and
 (ii) an inactive state, in which no signals are exchanged between the first terminal and the associated pair of second terminals.

The alternating switching of the pairs of second terminals is particularly useful in the already mentioned time division multiplexing systems. For instance, it is possible to attribute one pair of second terminals to a transmission channel and the other pair of second terminals to a reception channel in a time division multiplexing system.

In this case it is preferred that if a first one of the at least two Wilkinson elements is in an active state a second one of the at least two Wilkinson elements is in an inactive state and vice versa enabling the desired separation of transmission and reception of signals in time domain.

In an advantageous embodiment of the circuit the first terminal is connected to ground via a capacitor. The first and second arm of each Wilkinson element comprise an inductor. One end of the inductor is connected to the capacitor and the other end one end of the inductor is connected to the switchable component selectively connecting the other end of the inductor via a capacitance or via a low impedance connection to ground. The first and the second arm of every Wilkinson element are connected by a resistor.

The proposed structure of the circuit integrates power combiner and/or splitter capabilities with switching capability of a SPDT-switch.

In an alternative embodiment the switchable circuit comprises Wilkinson elements having high pass transmission lines, which, advantageously, consume less chip area than other types of Wilkinson elements. The first terminal of the circuit is connected to ground via an inductor. The first and second arm of each Wilkinson element comprise a capacitor, one terminal of which is connected with one second terminal and via a switchable component to ground. In this circuit a single inductor is sufficient for a plurality of transmission lines forming the arms of Wilkinson elements.

Preferably, a capacitor is connected in series between the first terminal and the inductor.

Advantageously, the switchable component is a transistor, in particular a transistor having a Schottky gate. In a particularly useful embodiment, the switchable component is a hetero bipolar transistor (HBT).

In a preferred embodiment the transistors in the same Wilkinson element are provided with the same gate voltage. Likewise, it is preferred that the gate voltages for the transistors in different Wilkinson elements are not the same. Controlling the gate voltages in this way is useful for the separation of transmission and reception of signals in a time division multiplexing system.

According to one embodiment a circuit comprises a plurality of the switchable combiner and/or splitter circuit. For example, in systems having phased array antennas with a large number of elementary antennas many signals have to be handled during transmission and reception. For handling the many signals it is necessary to cascade a plurality of the proposed switchable combiner and/or splitter circuit.

Finally, according to a second aspect a time division multiplex radar or data communication system is a suggested. The system realizes the advantages that have already been mentioned in the context of the switchable combiner and/or splitter circuit according to the first aspect of the invention.

BRIEF DESCRIPTION OF DRAWINGS

Exemplary embodiments of the present disclosure are illustrated in the drawings and are explained in more detail in the following description. In the figures, the same or similar elements are referenced with the same or similar reference signs. It shows:

FIG. 1 a conventional lumped component model of a conventional Wilkinson element;

FIG. 2A a lumped component transmission line with passive components;

FIG. 2B the lumped component transmission line of FIG. 2A utilizing a capacitance of a hetero bipolar transistor (HBT) in OFF state;

DETAILED DESCRIPTION

Figure 3:
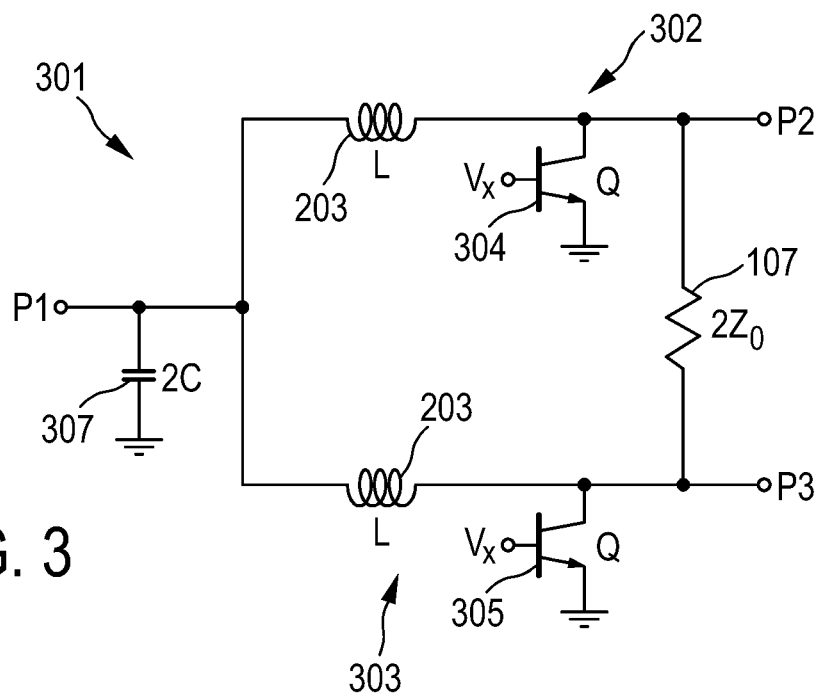
FIG. 3 a lumped component circuit diagram of the Wilkinson element utilizing the capacitance of an HBT in OFF state.

FIG. 1 shows a schematic block diagram of a Wilkinson element 100 having three terminals P1, P2, and P3. The term Wilkinson elements refers both to a Wilkinson power splitter and a Wilkinson power combiner. Their function will be explained further below. If the Wilkinson element 100 operates as a power splitter an input signal S1 is applied at terminal P1 and equally divided into output signals S2 and S3, which have the same amplitude and are in phase with each other. The output signals S2, S3 are connected to terminals P2,P3. The output signals S2 and S3 pass through a first arm 101 and the second arm 102, respectively, of the Wilkinson element 100. To this end, the first and second arms 101,102 of the Wilkinson element 100 are composed of quarter wave ($\lambda/4$) transmission lines 103, 104 having an impedance of $\sqrt{2}\, Z_0$, wherein the total impedance of the Wilkinson element 100 equals $Z_0$. In this way, all terminals P1, P2, and P3 are matched and the two output terminals P2, P3 are isolated from each other. One end of the quarter wave transmission lines 103, 104 are directly connected at a common node 106 and the other end of the quarter wave transmission lines 103, 104 are connected with a resistor 107 having a resistance of $2\, Z_0$, wherein $Z_0$ corresponds to the input impedance at terminals P1, P2, and P3. Unmatched portions of the output signals S2 and S3 are dissipated in resistor 107.

FIG. 2A shows a lumped component transmission line 201 connecting terminal P1 with terminal P2. Terminal P1 is connected via a capacitor 202 with the ground and via an inductor 203 with terminal P2. Terminal P2 is connected with ground by capacitor 204. The two capacitors 202, 204 have an equal capacitance C. The capacitance C and the inductance L of inductor 202 are chosen such that the overall impedance of the transmission line equals $\sqrt{2}\ Z_0$ at a given frequency, for instance 29 GHz. In this case the transmission line 201 represents a quarter wave transmission line 103 or 104 in the Wilkinson element 100 operating at a design frequency of 29 GHz. The design frequency of 29 GHz is chosen only as an example and can be lower or higher in other embodiments of the present invention.

FIG. 2B exhibits an alternative design for a transmission line 206, in which capacitor 204 of FIG. 2A connecting terminal P2 with ground is replaced by a hetero bipolar transistor (HBT) 207. The HBT 207 provides in its OFF state, i.e. when the gate voltage is 0V, a capacitance C that corresponds to the capacitance of capacitor 204 in FIG. 2A. As a result, when the gate voltage Vx=0V, the transmission line 206 forms of quarter wave transmission line having an impedance that equals $\sqrt{2}\ Z_0$. If, however, a positive gate voltage Vx is applied to the gate of the HBT 207, then the HBT 207 switches into its ON state and provides for a low impedance connection between terminal P2 and ground. As a result, a high impedance is created at terminal P1. Hence, the switching capability of HBT 207 enables switching on and off the transmission line 206. The high frequency switching capability of HBTs is used in high frequency radar and/or data communication systems to realize Single-Pole-Double-Through (SPDT) switches, which are generally necessary in time division multiplex systems.

FIG. 3 shows a Wilkinson element 301 comprising two switchable quarter wave transmission lines 302, 303 as arms of the Wilkinson element 301 provided that the gate voltages Vx of the two HBTs 304 and 305 is Vx=0V. In this case the HBTs 304, 305 are in OFF state and provide for a capacitance C as described with reference to FIG. 1. The terminals P2 and P3 are connected with a resistor 107 having a resistance equal to 2 $Z_0$. A capacitor 307 having a capacitance 2C connects terminal P1 with the ground. In this way, all terminals P1, P2, and P3 are matched. The impedance at all terminals is $Z_0$ at design frequency. In contrast to the Wilkinson element 100 shown in FIG. 1, the Wilkinson element 301 contains a switchable component, namely the HBTs 304 and 305, which is an essential aspect that will be explained further below.

Figure 4:
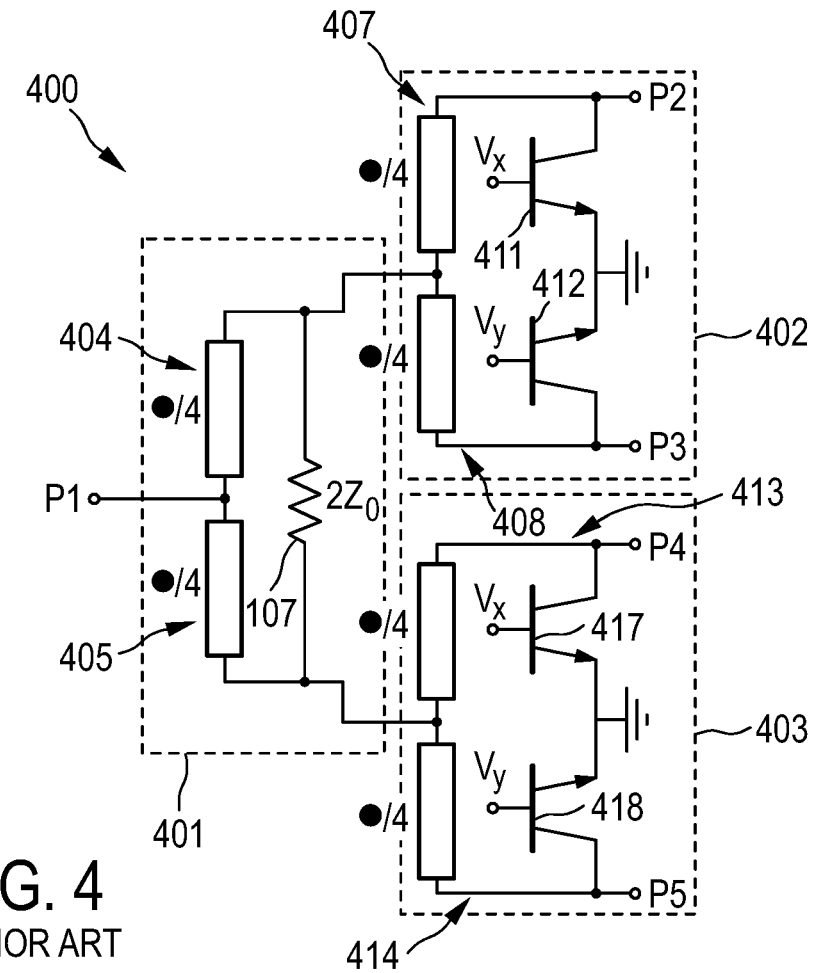
FIG. 4 a schematic block diagram of a conventional power combiner and/or splitter network.

FIG. 4 shows a conventional splitter and/or combiner network 400 that is used in time division multiplex systems as it has been explained in the background section. The network 400 comprises a Wilkinson element 401 and two SPDT switches 402, 403. In the splitting mode of the network 400, an input signal S1 is equally split between two arms 404, 405 of the Wilkinson element 401. The two arms 404, 405 are connected by a resistor 107 having a resistance that corresponds to twice in the impedance $Z_0$ of the Wilkinson element 401. The resistor 107 cancels signal portions in the arms 404, 405 of the Wilkinson element 401 that are out of phase.

The arm 404 is connected to the first SPDT switch 402. The first SPDT switch 402 includes two quarter wave transmission lines 407, 408 that are connected to terminals P2 and P3 of the SPDT switch 402. At the same time, terminals P2 and P3 are connected to ground by switchable HBTs 411 and 412, respectively. The HBTs 411, 412 are provided with gate voltages Vx, Vy. The network 400 is configured such that when HBT 411 is in its ON state, HBT 412 is in its OFF state and vice versa. The alternating switching is controlled by an external controller providing the corresponding gate voltages Vx,Vy. The controller is not shown in FIG. 4.

The second SPDT switch 403 is configured likewise and comprises quarter wave transmission lines 413, 414 and HBTs 417, 418 that receive the same gate voltages Vx, Vy like the HBTs 411, 412 in the first SPDT switch 402.

It is important to note that the gate voltages Vx and Vy are applied at the same time in both SPDT switches 402, 403. That means, if one transmission line in the first SPDT switch 402 is disabled because its associated HBT is in its ON state, then the corresponding transmission line in the second SPDT switch 403 is disabled as well. Specifically, if the transmission line 408 is disabled because the HBT 412 is in its ON state, then the transmission line 414 in the second SPDT switch 403 is disabled as well because the HBT 418 is in its ON state, too. Since the HBTs in SPDT switch 402, 403 are alternatingly switching between an ON and OFF state, always one transmission line in the SPDT switches 402, 403 is enabled and the other transmission line is disabled.

When the network 400 operates as a splitting network and, for instance, if the gate voltage Vx is positive then the HBTs 411 and 417 are in the ON state while gate voltage Vy=0V and the HBTs 412, 418 are in their OFF state. An input signal S1 applied to terminal P1 is equally split in Wilkinson element 401 and the split signals are outputted at terminals P3 and P5. In the alternative case when the gate voltage Vy is positive, then the HBTs 412, 418 are in there ON state, while the gate voltage Vx=0V and the HBTs 411, 417 are in their OFF state. In this situation an input signal S1 applied to terminal P1 appears as equally split signals at the output terminals P2 and P4.

Conversely, in reciprocal operation of the network 400 when the Wilkinson element 401 operates as a power combiner and when the gate voltage Vx=0V, then the HBTs 411, 417 are in their OFF state while at the same time the gate voltage Vy is positive and the HBTs 412, 418 are in there ON state. In this case, input signals S2 and S4 received at terminals P2 and P4 are combined in the Wilkinson element 401, while signals S3 and S5 received at terminals P3 and P5, respectively, are reflected. The combined signals S2 and S4 are provided as output signal S1 at terminal P1.

The network 400 shown in FIG. 4 can be utilized in time division multiplexing (TDM) systems wherein the splitting mode of the Wilkinson element 401 corresponds to a transmitting (Tx) mode of the TDM system, while the combining mode of the Wilkinson element 401 corresponds to the receiving (Rx) mode of the TDM system. Obviously, the states of the involved HBTs could be exchanged by exchanging the values of the gate voltages Vx and Vy in the splitting and combining mode or the Wilkinson element 401. In that case, the transmission mode of the network would involve terminals P2 and P4 while the receiving mode would involve terminals P3 and P5. This kind of selection is only a matter of design choice.

Figure 10A:
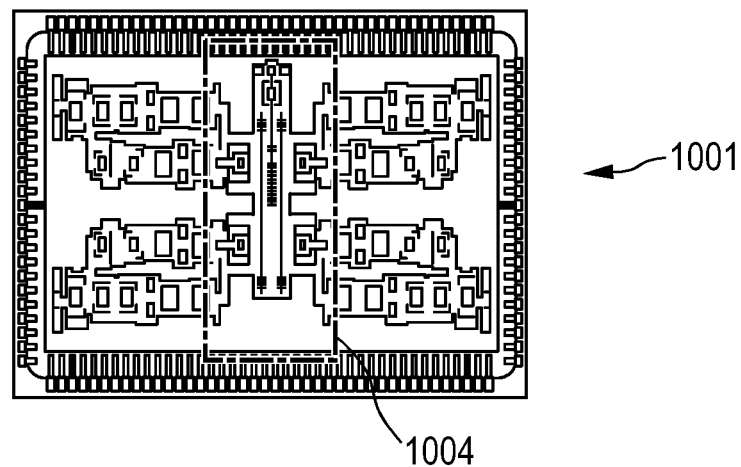
FIGS. 10A-10C micrographs of conventional beamforming chips.
Figure 10B:
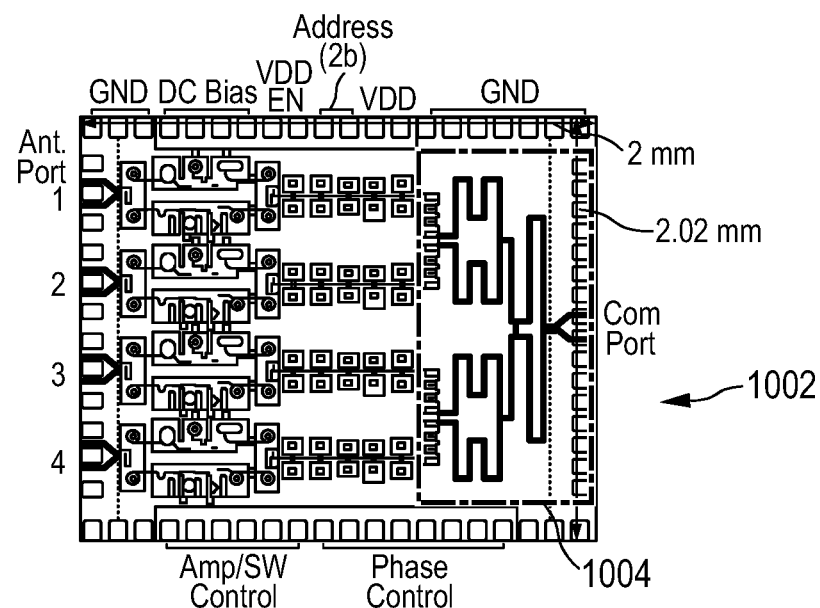
Figure 10C:
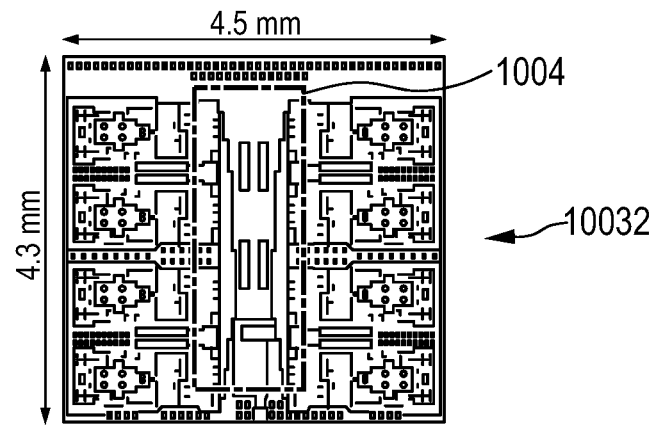

In a phased array antenna systems multiple networks as shown in FIG. 4 are cascaded to enable transmission to and reception from multiple array antennas for implementing directed transmission and reception of signals by applying beamforming techniques involving phase shifting of elementary array antennas. Typically, beamforming technologies are implemented in beamforming integrated circuits ("chips"). FIGS. 10A-10C show micrographs of beamforming chips 1001-1003, which are known in the art. A plurality of SPDT switches and Wilkinson elements occupy a big area on the respective chip as it is emphasized by the rectangles 1004. The present invention therefore proposes an alternative circuit that can be utilized in beamforming integrated circuits to reduce the required chip area. The proposed circuit occupies a smaller area on the chip and then conventional circuits that have been described with reference to FIG. 4. However, the present invention is not limited to the application in beamforming circuits.

Generally speaking, and Wilkinson element needs two arms to transmit and receive signals from two antennas. In antenna array systems the signals received from two elementary antennas are combined by Wilkinson combiner, which has two arms for combining the received signals as it has been described with reference to FIGS. 1 and 3. Two arms are also required when a signal needs to be transmitted to two elementary antennas. If there are more than two elementary antennas a corresponding number of Wilkinson elements is required. Hence, in systems switching between transmission and reception a minimum of four arms is necessary, namely two arms for transmission and two arms for reception. Obviously, the number of arms needs to be scaled with the number of elementary antennas in the system. But for explaining the present invention, it is sufficient to consider only a circuit with four arms.

Figure 5A:
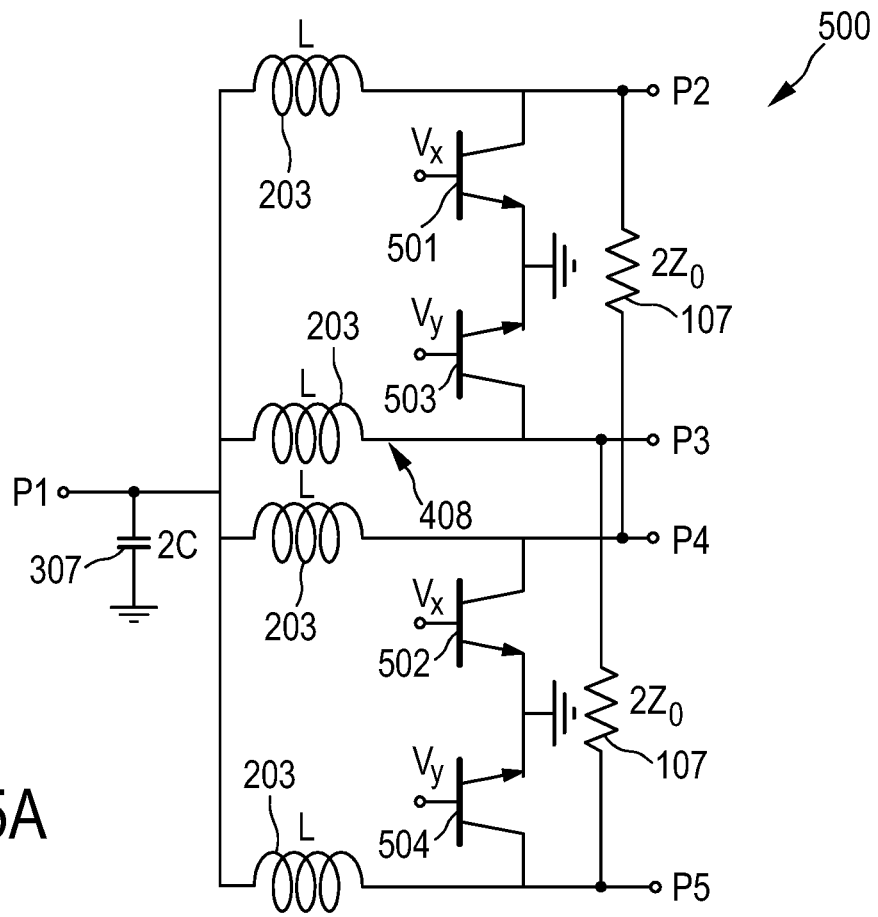
FIG. 5A a lumped component circuit diagram of a switchable circuit comprising Wilkinson elements integrated with two SPDT switches according to the present disclosure.

FIG. 5A exhibits a lumped circuit diagram of a switchable circuit 500 comprising two Wilkinson elements 301 according to FIG. 3. A first Wilkinson element includes the terminals P1, P2 and P4 and a second Wilkinson element includes the terminals P1, P3, and P5. The HBTs 501, 502 of the first Wilkinson element to receive the same gate voltage Vx. Hence, if Vx=0V then a signal S1 at terminal P1 will be divided equally and transmitted as a signals S2 and S4 to terminals P2 and P4, respectively. In reciprocal operation, when signals S2 and S4 are received at terminals P2 and P4, the signals S2 and S4 will be combined by the Wilkinson element and outputted as combined the signal S1 at terminal P1. If gate voltage Vx=0V, then gate voltage Vy is positive and the signal paths between terminal P1 on the one hand side and terminals P3 and P5 on the other hand side are disabled.

Figure 5B:
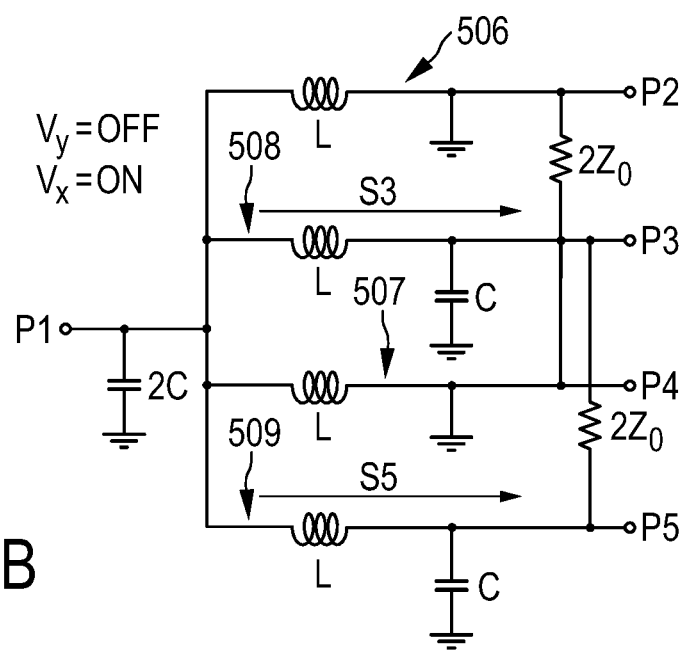
FIG. 5B a simplified diagram of the circuit according to FIG. 5A illustrating the signal flow.

When the gate voltage Vy=0V the HBTs 503, 504 are in their OFF state and an input signal S1 passes from terminal P1 to terminals P3 and P5 as it is illustrated in FIG. 5B. In FIG. 5B the first Wilkinson element comprises a first arm 506 and a second arm 507. The second Wilkinson element comprises a first arm 508 and a second arm 509. Hence the circuit 500 works at the same time like a Wilkinson element and an SPDT switch because the HBTs 501-504 work as switching component for the SPDT switches and provide the required capacitance for the quarter wave transmission lines of the Wilkinson elements. As a result, the circuit 500 requires fewer components than the conventional network 400 to achieve the same functionality. The performance of circuit 500 is illustrated by the parameters shown in FIGS. 9A-9D.

Figure 6:
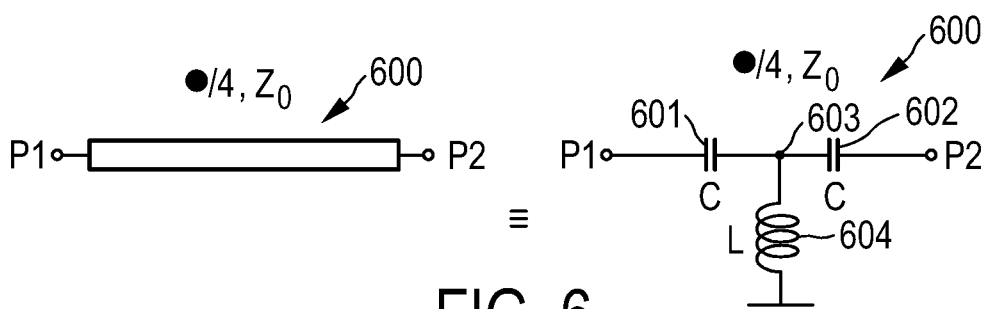
FIG. 6 a lumped component high-pass transmission line.

FIG. 6 shows an alternative implementation of a transmission line 600, which is implemented with a high pass lumped component version to save chip area. Two terminals P1 and P2 of the transmission line 600 are connected via two capacitors 601, 602 having a capacitance C. A tap 603 between the capacitors 601, 602 is connected with one terminal of an inductor 604, the other terminal of which is connected to ground. The inductor 604 has an inductivity L.

the topology of the transmission line 600 has the advantage that even if the number of equivalent transmission lines is increasing, still a single inductor 604 is sufficient because the potential between the two capacitors 601, 602 is the same and equal for all transmission lines 600. The shunt inductors 604 between the two capacitors 601, 602 can be replaced by a single inductor connected in parallel with the taps 603 of all transmission lines. This concept will be explained in more detail with the reference to FIGS. 7A and 7B.

Figure 7A:
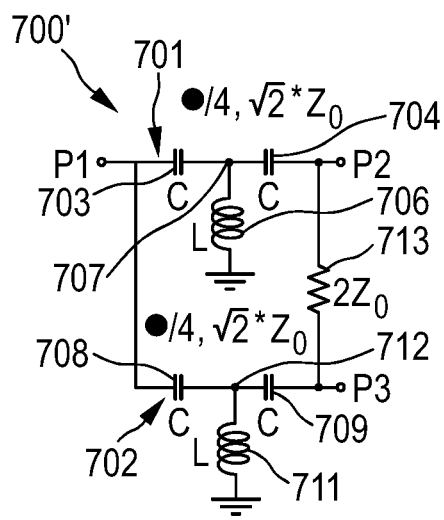
FIGS. 7A, 7B a lumped component circuit diagram of the Wilkinson elements comprising transmission lines according to FIG. 6.

FIG. 7A displays the Wilkinson element 700' comprising first and second arms 701, 702 connected in parallel with terminal P1. The first arm 701 is a transmission line 701 comprising two capacitors 703, 704 and an inductor 706 that links a tap 707 between the capacitors 703, 704 with ground. Likewise, the second arm 702 is a transmission line comprising two capacitors 708, 709 and an inductor 711 that links a tap 712 with ground. The arms 701, 702 connect a first terminal P1 with second terminals P2, P3, respectively. The transmission lines 701, 702 have an impedance of √2 $Z_0$. The terminals P1, P3 are connected with a resistor 713 having an impedance of 2 $Z_0$. The Wilkinson element 700' works in the same way as Wilkinson element 301 described in connection with FIG. 3.

Figure 7B:
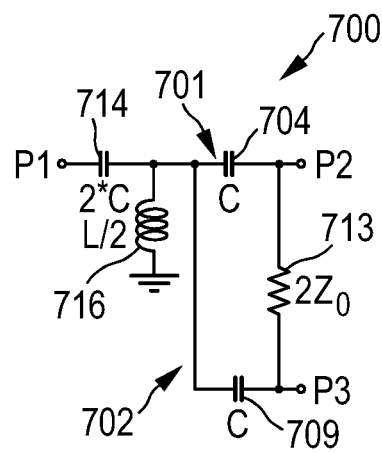

FIG. 7B exhibits an equivalent circuit of the circuit shown in FIG. 7A forming a Wilkinson element 700. Compared with the Wilkinson element 700', the two arms 701, 702 of the Wilkinson element 700 are simplified by combining the two capacitors 703, 708 into a single capacitor 714 having a capacity of 2C, and the inductors 706, 711 are replaced by a single inductor 716 having an inductance of L/2. Capacitors 704, 709 and resistor 713 remain unchanged.

The topology of Wilkinson element 700 shown in FIG. 7B can be used in a switchable by shunt transistors as it will be explained in connection with FIG. 8. The shunt transistors are for instance bipolar transistors and preferably hetero bipolar transistor (HBT).

Figure 8:
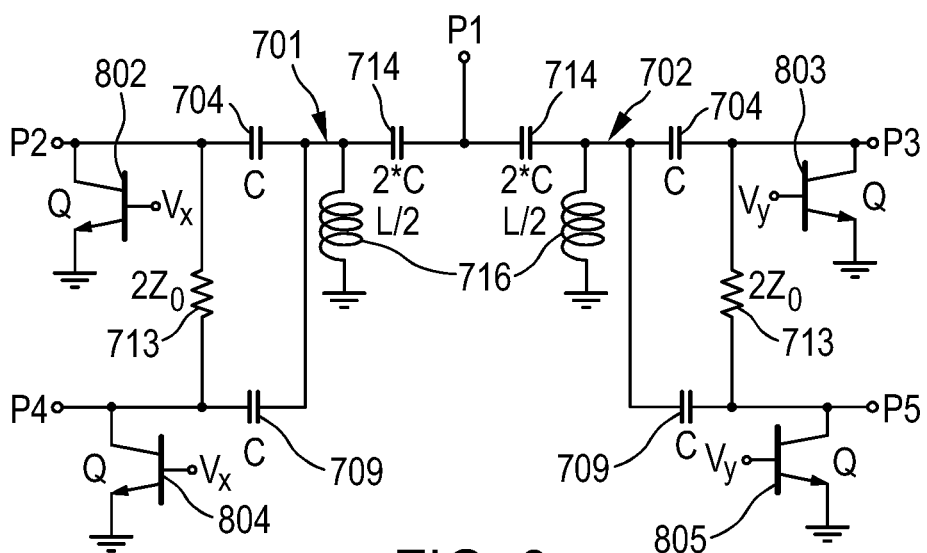
FIG. 8 a lumped component circuit diagram of a switchable circuit comprising Wilkinson elements according to FIG. 7B with switchable components.

FIG. 8 shows a lumped circuit diagram of a switchable circuit 800 comprising two Wilkinson elements 700 according to FIG. 7B. A first Wilkinson element includes the terminals P1, P2, and P4 and the second Wilkinson element includes the terminals P1, P3 and P5. Terminal P2 is connected to ground with the shunt transistor 802. Terminal P4 is connected to ground with the shunt transistor 804. Terminal P3 is connected to ground with the shunt transistor 803. Terminal P5 is connected to ground with the shunt transistor 805. Shunt transistors 802, 804 receive the same gate voltage Vx, and the shunt transistors 803, 805 receive the same gate voltage Vy. The gate voltages Vx, Vy are generated by a control not shown in FIG. 8. If the gate voltages Vx, Vy are positive, then the shunt transistors connect the associated terminals P2-P5 with low impedance to ground generating a high impedance between the associated terminals P2-P5 and terminal P1. The gate voltages Vx, Vy are controlled in an alternating manner to assume a positive value or 0V. I.e., if the gate voltage Vx=0V, then the gate voltage Vy is positive. In this case, terminals P2 and P4 are inactive and the signal flow between terminals P2 and P4 on the one hand and terminal P1 on the other hand is prevented. At the same time, terminals P3 and P5 are active and the signal flow between terminals P3 and P5 on the one hand and terminal P1 on the other hand is enabled. Advantageously, the switchable circuit 800 requires less chip area then the switchable circuit 500.

FIG. 9A-9D show elements of a scattering matrix of the switchable circuit 500 and 800 as a function of frequency. FIG. 6A shows the reflection coefficient S(3,3) at terminal P3 as a dotted line, reflection coefficient S(1,1) at terminal P1 as a dashed line and reflection coefficient S(2,2) as a solid line. As can be seen in the FIG. 9A, the reflection coefficients S(1,1) and S(3,3) are very low at the design frequency of 29 GHz while the reflection coefficient S(2,2) remains very high across the measured frequency band. That means in the situation illustrated in FIG. 5B the signal path from terminal P1 to terminal P3 has a low impedance whereas in the signal path between terminal P1 and terminal P2 has a high impedance. Since the same gate voltage Vx is applied to HBT 501 and HBT 502, also the signal path between terminal P1 and terminal P4 has a high impedance while the signal path between terminal P1 and terminal P5 is a low impedance. The terminals P3 and P5 could be assigned to a transmission channel in time division multiplexing system and the terminals P2 and P4 to a reception channel when the gate voltages Vx and Vy flip their values.

Figure 9A:
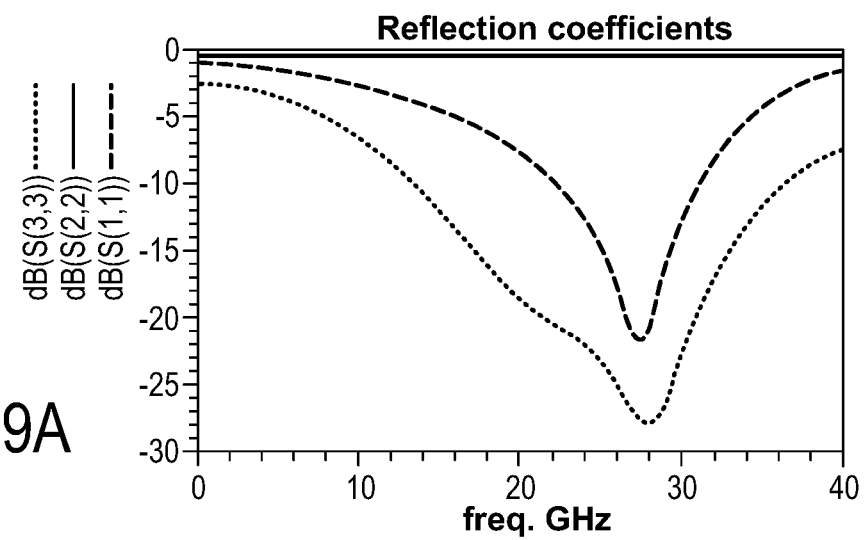
FIGS. 9A-9D illustrations of characteristic of dates of the circuit according to FIG. 5B.
Figure 9B:
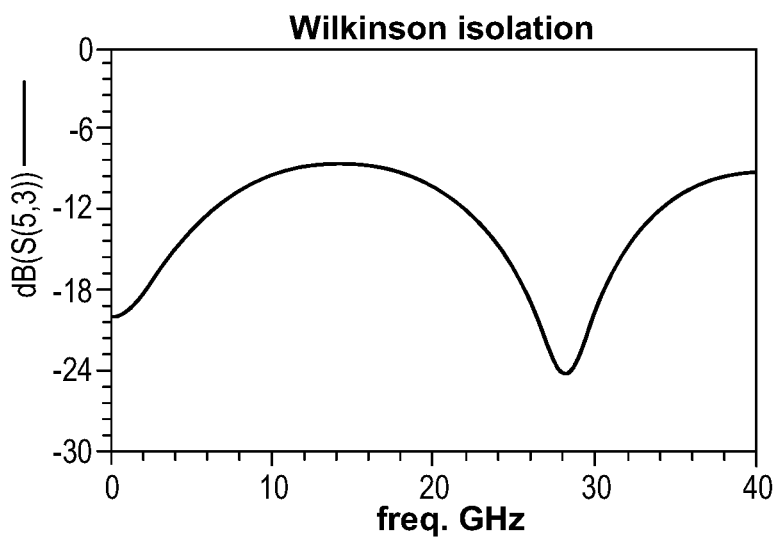

FIG. 9B shows scattering element S(5,3) as a function of frequency that illustrates a high degree of isolation between the two arms 508, 509 of the Wilkinson element. The scattering element describes the isolation of the two arms 508, 509 when the two arms 508, 509 are active and the Wilkinson element comprising the two arms 508, 509 is in its normal operation as a power splitter or combiner, which means that signals S1, S3, and S5 can flow as input or output signals between terminal P1 on the one side and terminals P3 and P5 on the other side. The same behaviour is observed for scattering element S(4,2) describing the isolation between the arms 506, 507 of the other Wilkinson element behaves similarly. However, the scattering element S(4,2) is not shown in FIG. 6B.

Figure 9C:
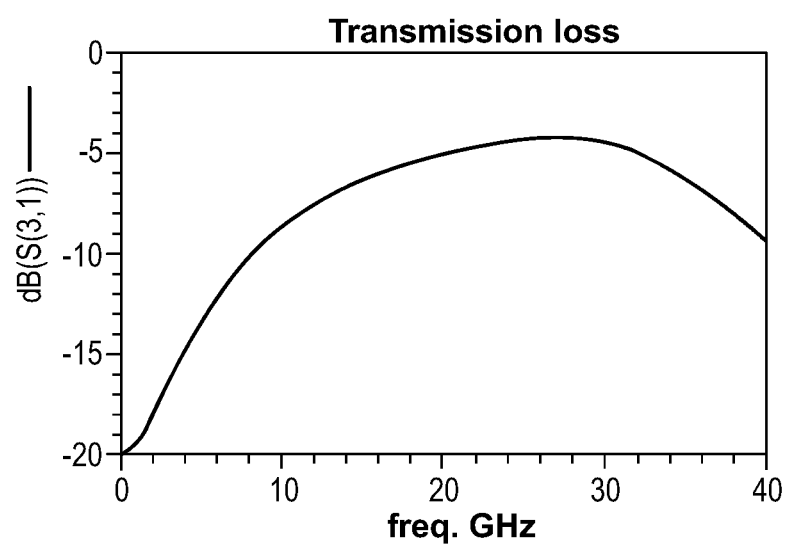

FIG. 9C displays scattering element S(3,1) illustrating the transmission loss between terminals P1 and P3 as a function of frequency. In a wide frequency band between 20 to 30 GHz the transmission loss is a smaller than −5 dB.

Figure 9D:
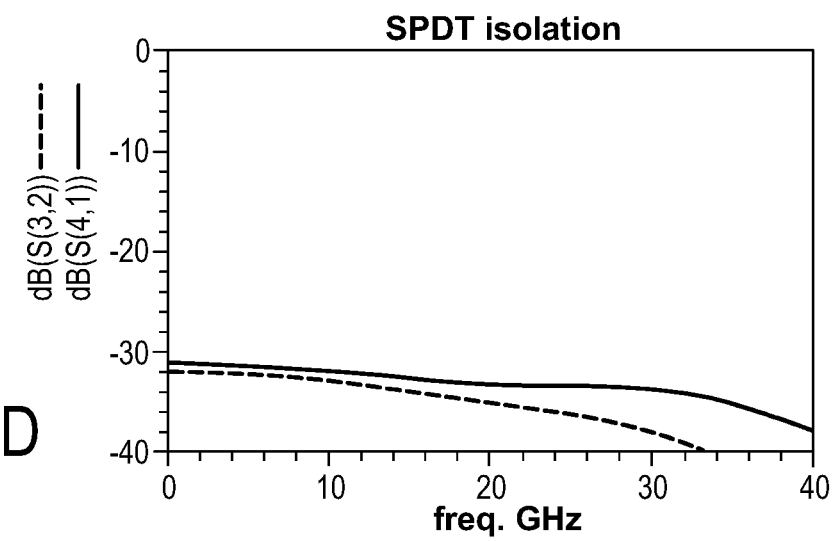

Finally, FIG. 9D shows the scattering element S(3,2) describes the isolation between the arms 506, 508 when the arm 506 is switched off while the arm 508 is switched on. The isolation between the arms 506, 508 is closely related with the SPDT functionality. The scattering element S(4,1) describes the attenuation between the input port P1 and the output port P4, which is inactive (FIG. 5B). This attenuation can also be seen as the isolation between input P1 and inactive output P4 of the SPDT switch.

LIST OF REFERENCE SIGNS

100 Wilkinson element
101 first arm of Wilkinson element
102 second arm of the Wilkinson element
103,104 quarter wave transmission line
106 common node of transmission line
107 resistor
201 transmission line
202 capacitor
203 inductor
204 capacitor
206 transmission line
207 HBT
301 Wilkinson element
302,303 switchable transmission line
304, 305 HBT
307 capacitor
400 combiner/splitter network
401 Wilkinson element
402,403 SPDT switch
404, 405 arms of Wilkinson element
407,408 quarter wave transmission line
411,412 HBT
413,414 quarter wave transmission line
417, 418 HBT
500 switchable circuit
501,502 HBT
503,504 HBT
506 first arm of first Wilkinson element
507 second arm of first Wilkinson element
508 first arm of second Wilkinson element
509 second arm of second Wilkinson element
600 transmission
601,602 capacitor
603 tap
604 inductor
700,700' Wilkinson element
701 first arm of Wilkinson element
702 second arm of Wilkinson element
703,704 capacitor
706 inductor
707 tap
708, 709 capacitor
711 inductor
712 tap
713 resistor
800 switchable circuit
802-805 shunt transistor
1001-1003 beamforming chips
1004 rectangle

CITED LITERATURE

[1] W. Zhu et al., "A 24-28 GHz Power and Area Efficient 4-Element Phased-Array Transceiver Front-End with 21.1%/16.6% Transmitter Peak/OP1 dB PAE Supporting 2.4 Gb/s in 256-QAM for 5-G Communications," 2020 IEEE Radio Frequency Integrated Circuits Symposium (RFIC), 2020, pp. 351-354, doi: 10.1109/RFIC49505.2020.9218328.

[2] D. Kang, J. Kim, B. Min and G. M. Rebeiz, "Single and Four-Element Ka-Band Transmit/Receive Phased-Array Silicon RFICs With 5-bit Amplitude and Phase Control," in IEEE Transactions on Microwave Theory and Techniques, vol. 57, no. 12, pp. 3534-3543, December 2009, doi: 10.1109/TMTT.2009.2033302.

[3] C. N. Chen et al., "A 38-GHz 32-Element Phased-Array Transmitter Based on Scalable 8-Element Phased-Array Modules for 5G MMW Data Links," 2020 IEEE/MTT-S Inter-national Microwave Symposium (IMS), 2020, pp. 695-698, doi: 10.1109/IMS30576.2020.9224068.

What is claimed is:

1. A switchable combiner and/or splitter circuit comprising at least two Wilkinson elements, wherein the switchable circuit comprises one first terminal and for each Wilkinson element one pair of second terminals associated with the corresponding Wilkinson element, wherein each Wilkinson element connects the first terminal with the associated pair of second terminals, wherein each Wilkinson element comprises a first and a second arm, wherein the first arm connects the first terminal with one terminal of the associated pair of second terminals, and wherein the second arm connects the first terminal with the other terminal of the associated pair of second terminals wherein one switchable component is integrated in every arm of the at least two Wilkinson elements wherein the switchable components alternatingly switch the at least two Wilkinson elements between
  (i) an active state, in which signals are transmitted from the first terminal to the associated pair of second terminals or are received from the associated pair of second terminals at the first terminal, and
  (ii) an inactive state, in which no signals are exchanged between the first terminal and the associated pair of second terminals,
and the switchable components-enabling selectively activating the associated pair of second terminals,
wherein the first terminal is connected to ground via a single inductor, wherein the first and second arm of each Wilkinson element comprise a capacitor, one terminal of which is connected with one second terminal and via a switchable component in every arm of the Wilkinson element to ground.

2. The circuit according to claim 1, wherein if a first one of the at least two Wilkinson elements is in an active state, a second one of the at least two Wilkinson elements is in an inactive state and vice versa.

3. The circuit according to claim 1, wherein the first terminal is connected to ground via a capacitor, wherein the first and second arm of each Wilkinson element comprise an inductor, wherein one end of the inductor is connected to the capacitor and the other end of the inductor is connected to the switchable component selectively connecting the other end of the inductor via a capacitance or via a low impedance connection to ground, and wherein the first and the second arm of every Wilkinson element are connected with a resistor.

4. The circuit according to claim 1, wherein a capacitor is connected in series between the first terminal and the inductor.

5. The circuit according to claim 1, wherein the switchable component is a transistor, in particular a transistor having a Schottky gate and more particularly the switchable component is a hetero bipolar transistor.

6. The circuit according to claim 5, wherein the transistors in the same Wilkinson element are provided with the same gate voltage.

7. The circuit according to claim 6, wherein the gate voltages for the transistors in different Wilkinson elements are not the same.

8. A circuit comprising a plurality of circuits according to claim 1.

9. A time division multiplex radar or data communication system comprising a circuit according to claim 1.

* * * * *